US010971361B2

(12) United States Patent
Mizumura

(10) Patent No.: US 10,971,361 B2
(45) Date of Patent: Apr. 6, 2021

(54) LASER ANNEALING METHOD, LASER ANNEALING APPARATUS, AND THIN FILM TRANSISTOR SUBSTRATE

(71) Applicant: V TECHNOLOGY CO., LTD., Yokohama (JP)

(72) Inventor: Michinobu Mizumura, Yokohama (JP)

(73) Assignee: V TECHNOLOGY CO., LTD., Yokohama (JP)

(*) Notice: Subject to any disclaimer, the term of this patent is extended or adjusted under 35 U.S.C. 154(b) by 18 days.

(21) Appl. No.: 16/672,329

(22) Filed: Nov. 1, 2019

(65) Prior Publication Data

US 2020/0066517 A1 Feb. 27, 2020

Related U.S. Application Data

(60) Division of application No. 16/109,640, filed on Aug. 22, 2018, which is a continuation of application No. PCT/JP2016/088857, filed on Dec. 27, 2016.

(51) Int. Cl.
H01L 21/02 (2006.01)
H01L 27/12 (2006.01)
(Continued)

(52) U.S. Cl.
CPC .. *H01L 21/02675* (2013.01); *H01L 21/02381* (2013.01); *H01L 21/02433* (2013.01);
(Continued)

(58) Field of Classification Search
None
See application file for complete search history.

(56) References Cited

U.S. PATENT DOCUMENTS 6,452,213 B1 9/2002 Kimura et al.
2005/0139925 A1* 6/2005 You .................. H01L 21/02675
257/351
(Continued)

FOREIGN PATENT DOCUMENTS

JP 09-266316 10/1997
JP 2001-127302 5/2001
(Continued)

OTHER PUBLICATIONS

International Preliminary Report on Patentability from PCT/JP2016/088857, dated Sep. 7, 2018, 12 pages including translation.
Japanese Office Action from 2016-032469, dated Sep. 10, 2019, 4 pages including partial English language translation.
(Continued)

*Primary Examiner* — Michelle Mandala
(74) *Attorney, Agent, or Firm* — Morgan, Lewis & Bockius LLP

(57) ABSTRACT

A laser annealing method is for irradiating an amorphous silicon film formed on a substrate 6 with laser beams and crystalizing the amorphous silicon film, wherein a plurality of first and second TFT formation portions 23, 24 on the substrate 6 are irradiated with laser beams at differing irradiation doses so as to crystalize the amorphous silicon film in the first TFT formation portions 23 into a polysilicon film having a crystalline state and crystalize the amorphous silicon film in the second TFT formation portions 24 into a polysilicon film having another crystalline state that is different from that of the polysilicon film in the first TFT formation portions 23.

3 Claims, 13 Drawing Sheets

(51) Int. Cl.
*H01L 21/324* (2006.01)
*H01L 29/04* (2006.01)
*H01L 29/786* (2006.01)
*B23K 26/352* (2014.01)

(52) U.S. Cl.
CPC ...... *H01L 21/02532* (2013.01); *H01L 21/324* (2013.01); *H01L 27/1285* (2013.01); *H01L 27/1288* (2013.01); *H01L 29/04* (2013.01); *H01L 29/78675* (2013.01); *B23K 26/352* (2015.10); *H01L 21/02678* (2013.01); *H01L 21/02691* (2013.01)

(56) References Cited

U.S. PATENT DOCUMENTS

| | | |
|---|---|---|
| 2006/0024858 A1 | 2/2006 | Kumoni |
| 2008/0237724 A1* | 10/2008 | Nakata .................. H01L 29/04 257/368 |
| 2012/0032179 A1 | 2/2012 | Saitoh et al. |

FOREIGN PATENT DOCUMENTS

| | | |
|---|---|---|
| JP | 2012-004250 | 1/2012 |
| JP | 2013-191743 | 9/2013 |
| WO | WO 2011/161715 | 12/2011 |

OTHER PUBLICATIONS

Office Action dated Nov. 26, 2019, which issued in U.S. Appl. No. 16/109,640, 12 pages.

\* cited by examiner

LASER ANNEALING METHOD, LASER ANNEALING APPARATUS, AND THIN FILM TRANSISTOR SUBSTRATE

This application is a divisional application of application Ser. No. 16/109,640, filed on Aug. 22, 2018, now U.S. Pat. No. 10,950,437, which is a continuation application of International Application No. PCT/JP2016/088857, filed on Dec. 27, 2016, the entirety of each of which is incorporated herein by reference.

BACKGROUND OF THE INVENTION

Field of the Invention

The present invention relates to a laser annealing method for irradiating an amorphous silicon film with laser beams and crystalizing the amorphous silicon film, and specifically relates to a laser annealing method, a laser annealing apparatus, and a thin film transistor substrate which allow for manufacturing a plurality of thin film transistors with different electronic properties in a single laser annealing step.

Description of Related Art

In a conventional laser annealing method, an amorphous silicon film formed on the entire surface of a substrate is uniformly irradiated with a line beam produced using a cylindrical lens while the substrate is scanned in the direction orthogonal to the longitudinal axis of the line beam, so that the amorphous silicon film is uniformly crystalized (for example, refer to JP 2013-191743 A).

With such a conventional laser annealing method, which uniformly crystallizes the amorphous silicon film over the entire surface of the substrate, the resultant polysilicon semiconductor layers in all thin film transistor formation portions have the same crystalline state as each other. Consequently, all the thin film transistors formed with this conventional laser annealing method have the same electronic properties.

Here, in thin film transistor substrates for, for example, organic EL applications, electronic properties required for driver thin film transistors that control currents for driving pixels are inherently different from those required for selector thin film transistors that control the gate voltages of the driver thin film transistors to select pixels. However, when such a thin film transistor substrate is manufactured by using the conventional laser annealing method, the driver thin film transistors and the selector thin film transistors must have the same electronic properties for the above reason.

Therefore, conventionally, to make all the thin film transistors capable of supplying a large current sufficient to satisfy the electronic properties required for driver thin film transistors, laser annealing has been performed so as to sufficiently promote crystal growth and increase the mobility of electrons by increasing the irradiation doses (energy) of the laser beams. However, this increases the off-state leakage current in each selector thin film transistor, thereby making it difficult to maintain the gate voltage of each driver thin film transistor at a constant level.

SUMMARY OF THE INVENTION

In order to deal with at least some of these problems, an object of the invention is to provide a laser annealing method, a laser annealing apparatus, and a thin film transistor substrate, which allow for manufacturing a plurality of thin film transistors with different electronic properties in a single laser annealing step.

In order to achieve this object, according to a first aspect of the invention, provided is a laser annealing method for irradiating an amorphous silicon film formed on a substrate with laser beams and crystallizing the amorphous silicon film, wherein a plurality of thin film transistor formation portions on the substrate are irradiated with laser beams at differing irradiation doses so as to crystalize the amorphous silicon film in the plurality of thin film transistor formation portions into polysilicon films having different crystalline states.

According to a second aspect of the invention, provided is a laser annealing method for irradiating an amorphous silicon film formed on a substrate with laser beams and crystallizing the amorphous silicon film, wherein, while the substrate is scanned, first and second thin film transistor formation portions on the substrate are irradiated with laser beams at differing irradiation doses so as to crystalize the amorphous silicon film in the first thin film transistor formation portions into a polysilicon film having a crystalline state and crystalize the amorphous silicon film in the second thin film transistor formation portions into a polysilicon film having another crystalline state that is different from that of the polysilicon film in the first thin film transistor formation portions.

According to a third aspect of the invention, provided is a laser annealing apparatus for using in the laser annealing method according to the second aspect of the invention, for irradiating an amorphous silicon film formed on a substrate with laser beams and crystallizing the amorphous silicon film, the apparatus comprising: a scanning means for scanning the substrate; a light shielding mask which is disposed facing a scanning surface of the scanning means and provided with a plurality of mask patterns corresponding to first and second thin film transistor formation portions on the substrate; and a projecting optical system which is provided on a scanning means side of the light shielding mask and forms images of the plurality of mask patterns on the substrate, wherein the light shielding mask has a plurality of mask patterns arranged either in a row extending in a direction orthogonal to a scanning direction of the substrate or in a matrix with columns extending in the scanning direction of the substrate and rows extending in the direction orthogonal to the scanning direction, and a light transmission amount of mask patterns, among the plurality of mask patterns, corresponding to the second thin film transistor formation portions is adjusted to be smaller than a light transmission amount of mask patterns, among the plurality of mask patterns, corresponding to the first thin film transistor formation portions, so that the first and second thin film formation portions are irradiated with laser beams at differing irradiation doses so as to crystalize the amorphous silicon film in the first thin film transistor formation portions into a polysilicon film having a crystalline state and crystalize the amorphous silicon film in the second thin film transistor formation portions into a polysilicon film having another crystalline state that is different from that of the polysilicon film in the first thin film transistor formation portions.

According to a fourth aspect of the invention, provided is laser annealing apparatus for using in the laser annealing method according to the second aspect of the invention, for irradiating an amorphous silicon film formed on a substrate with laser beams and crystallizing the amorphous silicon film, the apparatus comprising: a scanning means for scanning the substrate; a light shielding mask which is disposed facing a scanning surface of the scanning means and provided with a plurality of mask patterns corresponding to first and second thin film transistor formation portions on the substrate; and a projecting optical system which is provided on a scanning means side of the light shielding mask and forms images of the plurality of mask patterns on the substrate, wherein the light shielding mask has a plurality of mask patterns arranged in a matrix with columns extending in a scanning direction of the substrate and rows extending in a direction orthogonal to the scanning direction, and a number of mask patterns, among the plurality of mask patterns, that are lined up in the scanning direction of the substrate so as to correspond to the second thin film transistor formation portions is adjusted to be smaller than a number of mask patterns, among the plurality of mask patterns, that are lined up in the scanning direction so as to correspond to the first thin film transistor formation portions, so that the first and second thin film formation portions are irradiated with laser beams at differing irradiation doses so as to crystalize the amorphous silicon film in the first thin film transistor formation portions into a polysilicon film having a crystalline state and crystalize the amorphous silicon film in the second thin film transistor formation portions into a polysilicon film having another crystalline state that is different from that of the polysilicon film in the first thin film transistor formation portions.

According to a fifth aspect of the invention, provided is a thin film transistor substrate manufactured by using the laser annealing method according to the second aspect of the invention, on which a plurality of driver thin film transistors for driving pixels and a plurality of selector thin film transistors for activating the driver thin film transistors to select pixels are provided, wherein a polysilicon semiconductor layer in each of the driver thin film transistors has a crystalline state different from that of a polysilicon semiconductor layer in each of the selector thin film transistors.

According to the present invention, by irradiating a plurality of thin film transistor formation portions on a substrate with laser beams at differing irradiation doses, it is possible to crystallize the amorphous silicon film in thin film transistor formation portions into polysilicon films having different crystalline states. Thus, the present invention allows for manufacturing a plurality of thin film transistors with different electronic properties in a single laser annealing step.

BRIEF DESCRIPTION OF THE DRAWINGS

FIG. 2A is a plan view; and FIG. 2B is a cross-sectional view taken along line A-A in FIG. 2A; and FIG. 2C is a cross-sectional view taken along line B-B in FIG. 2A.

FIG. 10A shows the properties of the driver thin film transistors; and FIG. 10B shows the properties of the selector thin film transistors.

FIG. 11A is a plan view; and FIG. 11B is a cross-sectional view taken along line A-A in FIG. 11A.

FIG. 13A is a plan view; and FIG. 11B is a cross-sectional view taken along line A-A in FIG. 13A.

DESCRIPTION OF PREFERRED EMBODIMENTS

Figure 1:
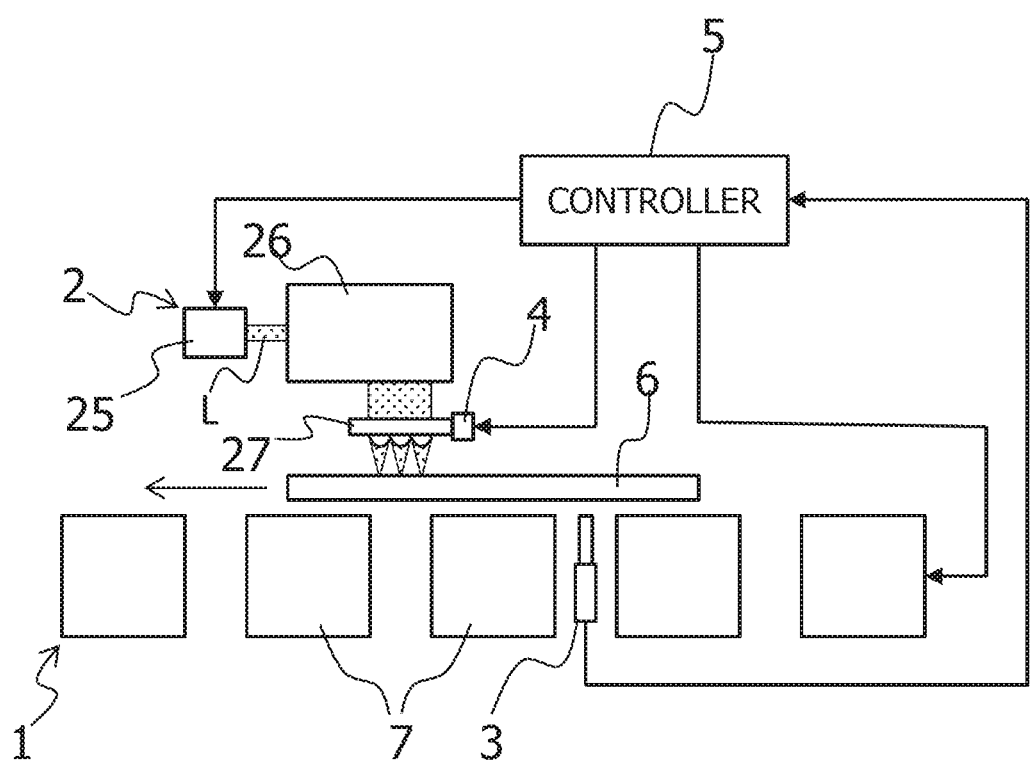
FIG. 1 is a schematic configuration diagram showing a first embodiment of a laser annealing apparatus according to the present invention.
Figure 2A:
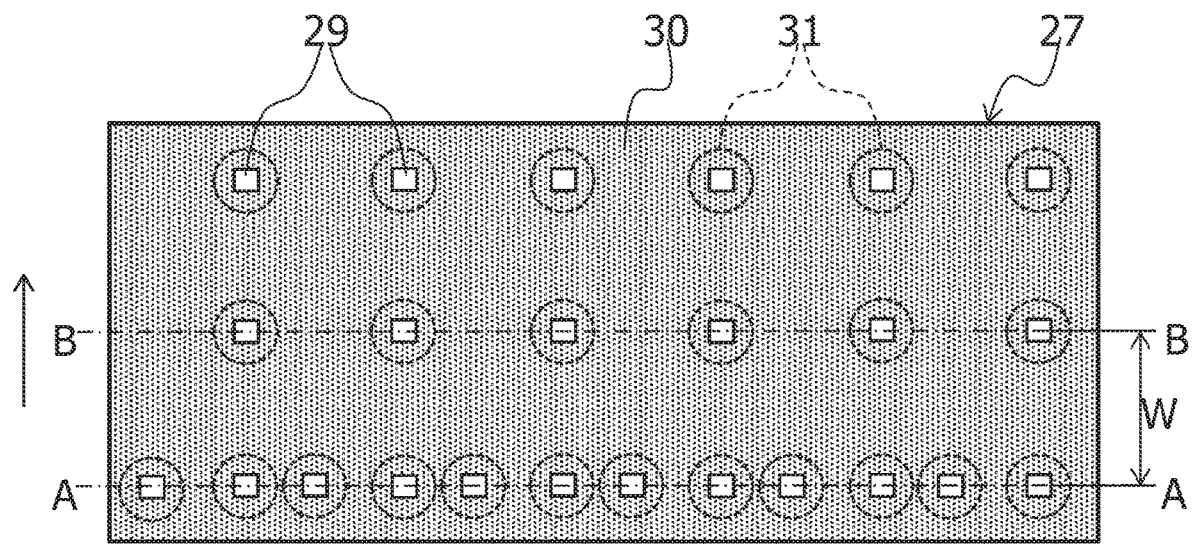
FIGS. 2A to 2C are diagrams showing a configuration example of a microlens array used in the first embodiment.
Figure 2B:
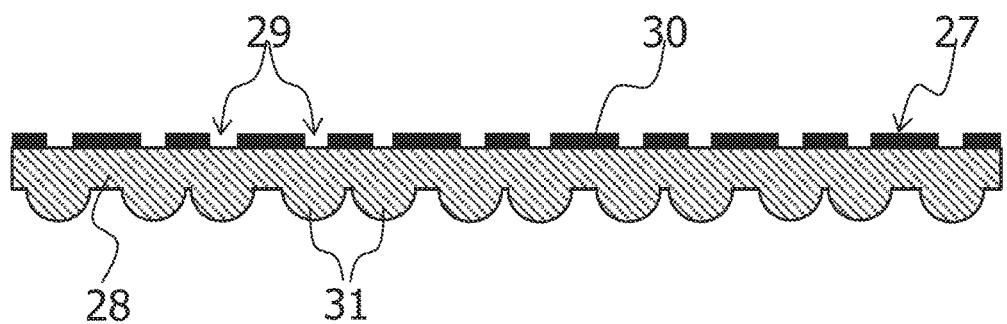
Figure 2C:
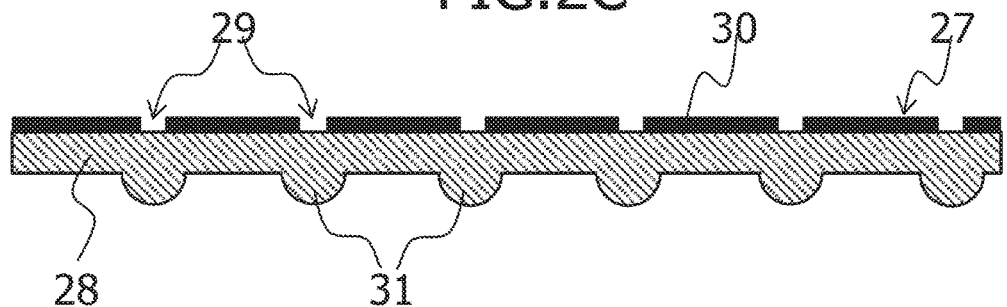

Embodiments of the present invention will be described in detail with reference to the accompanying drawings. FIG. 1 is a schematic configuration diagram showing a first embodiment of a laser annealing apparatus according to the present invention. FIGS. 2A to 2C are diagrams showing a configuration example of a microlens array used in the first embodiment. FIG. 2A is a plan view. FIG. 2B is a cross-sectional view taken along line A-A in FIG. 2A. FIG. 2C is a cross-sectional view taken along line B-B in FIG. 2A. This laser annealing apparatus crystallizes an amorphous silicon film formed on a substrate by irradiating the film with laser beams, and comprises a scanning means 1, a laser illumination optical system 2, an imaging means 3, an alignment means 4, and a controller 5.

The scanning means 1 scans, in the direction indicated by the arrow in FIG. 1, an annealing-target substrate (simply referred to as "substrate" below) 6 having an amorphous silicon film formed on its surface on which a plurality of thin film transistor formation portions are arranged in a matrix by holding, for example, the edges of the substrate 6 with the substrate 6 floating slightly above the scanning surface. The scanning means 1 has a plurality of flotation units 7 arranged in a row and thus can uniformly impart a floating ability to the substrate 6.

The description herein assumes that the substrate 6 is formed into a substrate having thin film transistors for organic EL applications. In the thin film transistor substrate for organic EL applications, thin film transistors (hereafter, referred to as "TFTs") for organic EL applications as shown in FIG. 3 are formed at the intersections of data lines 8 and select lines 9 provided longitudinally and laterally as shown in FIG. 3.

Figure 3:
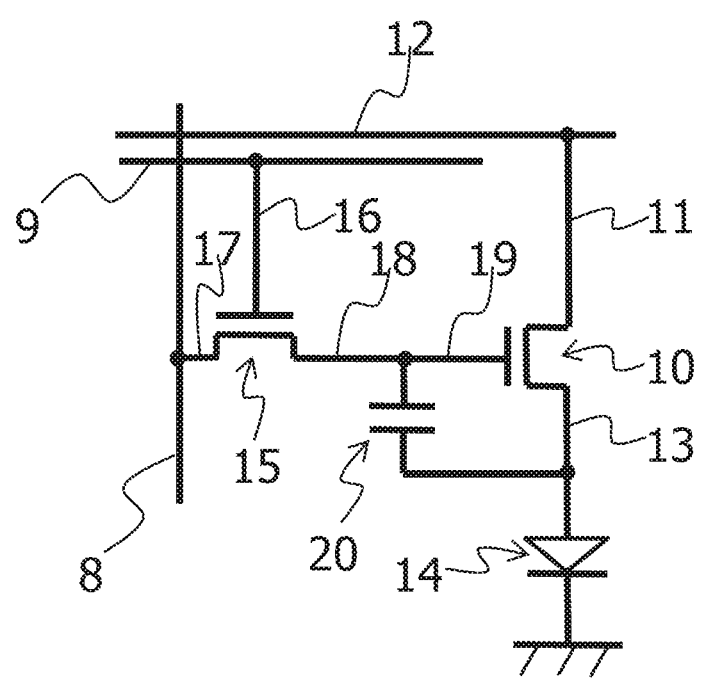
FIG. 3 is a circuit diagram showing a configuration example of a thin film transistor for organic EL applications.

More specifically, the TFT positioned on the right side in FIG. 3 is a driver TFT 10 that controls the drive current of an organic EL pixel. The driver TFT 10 includes a drain 11 connected to a power supply line 12 and a source 13 connected to the anode of the organic EL 14. The TFT positioned on the left side in FIG. 3 is a selector TFT 15 that controls the gate voltage of the driver TFT 10. The selector TFT 15 includes a gate 16 connected to a select line 9, a drain 17 connected to a data line 8, and a source 18 connected to a gate 19 of the driver TFT 10. In addition, a storage capacitor 20 is provided between the gate 19 and the source 13 of the driver TFT 10. The cathode of the organic EL 14 is grounded. Note that the drains and sources of the TFTs may be arranged in the opposite way.

Figure 4:
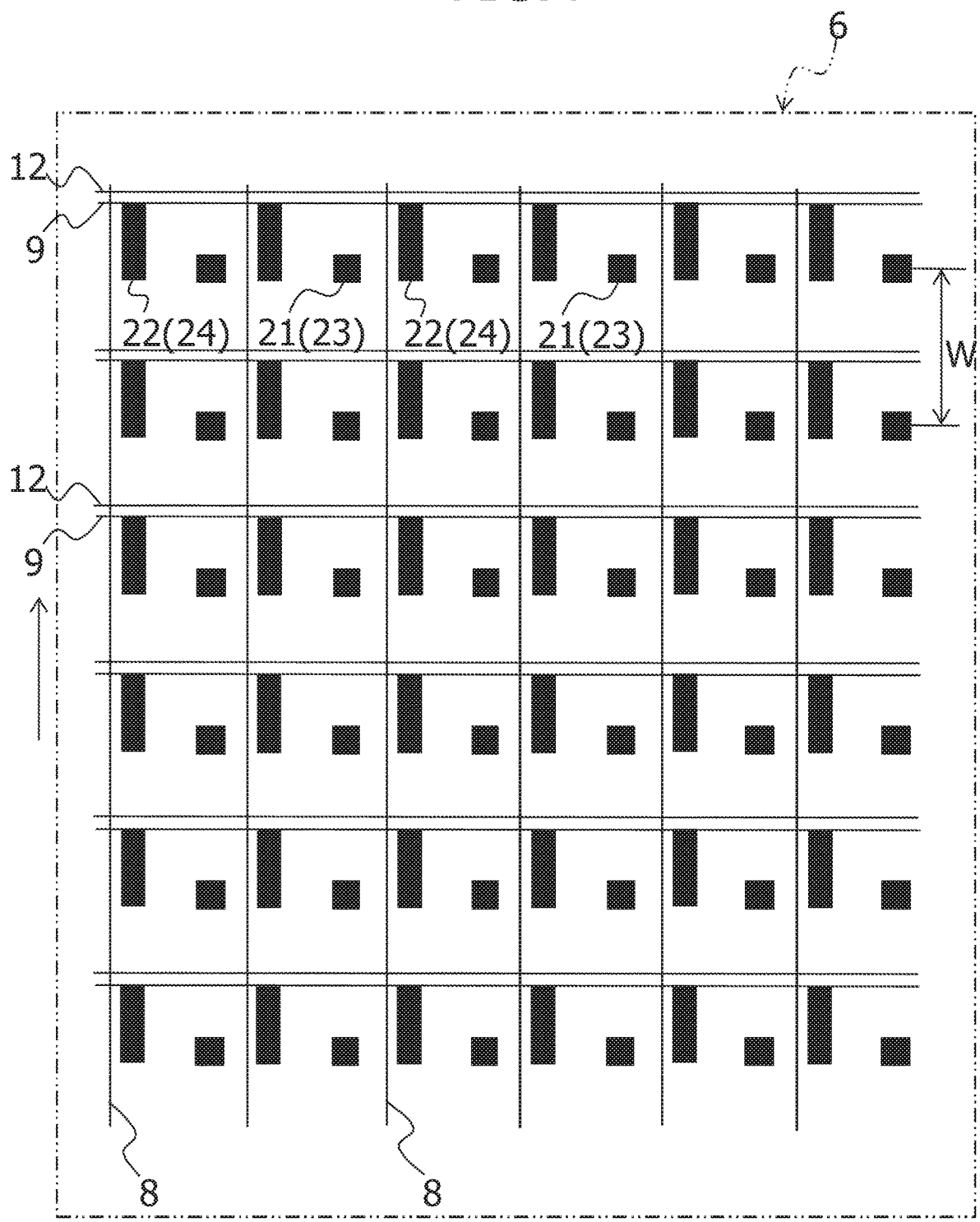
FIG. 4 is a plan view showing a configuration example of an annealing-target substrate on which a plurality of thin film transistor formation portions are arranged.

As shown in FIG. 4, the data lines 8, the select lines 9, and the power supply lines 12 are provided on the substrate 6 so as to be insulated from each other. Also, the gate electrodes 21 of the driver TFTs 10 and the gate electrodes 22 of the selector TFTs 15 are previously provided on the substrate 6. On the gate electrodes 21, 22, an amorphous silicon film is formed with an insulating film (not shown) made of $SiO_2$ or the like interposed therebetween. In this case, the region on the gate electrode 21 of each driver TFT 10 serves as a first TFT formation portion 23, and the region on the gate electrode 22 of each selector TFT 15 serves as a second TFT formation portion 24. In the present embodiment, the substrate 6 is scanned in the direction (indicated by the arrow in FIG. 4) orthogonal to the direction in which the first and second TFT formation portions 23, 24 are arranged alternately, that is, scanned in the direction parallel with the data lines 8.

A laser illumination optical system 2 is provided above the scanning means 1. This laser illumination optical system 2 irradiates the first and second TFT formation portions 23, 24 on the substrate 6 with pulse laser beams L at different irradiation doses so as to crystalize the amorphous silicon film in the first TFT formation portions 23 into a polysilicon film having a crystalline state and crystalize the amorphous silicon film in the second TFT formation portions 24 into a polysilicon film having another crystalline state that is different from that of the polysilicon film in the first TFT formation portions 23. The laser illumination optical system 2 comprises, in order from upstream to downstream in the direction of laser travel, a laser source 25, a coupling optical system 26, and a microlens array 27.

Here, the laser source 25 emits, for example, a pulse laser beam L at a predetermined frequency, such as a YAG laser with a wavelength of 355 nm or an excimer laser with a wavelength of 308 nm.

The coupling optical system 26 expands the luminous flux diameter of the pulse laser beam L emitted from the laser source 25, and then converts the pulse laser beam L into parallel beams having uniform luminance distribution, thereby irradiating the microlens array 27 (described later) with the parallel beams. The coupling optical system 26 comprises a beam expander, a photo integrator, a collimator lens, and the like which are not shown.

The microlens array 27 is disposed facing the scanning surface of the scanning means 1. As shown in FIG. 2B, the microlens array 27 includes a transparent substrate 28 such as a quartz substrate, a light shielding mask 30, and a plurality of microlenses (projecting optical system) 31. The light shielding mask 30 is provided on the light incidence side of the transparent substrate 28, and has a plurality of mask patterns 29 so as to correspond to the first and second TFT formation portions 23, 24 on the substrate 6. The microlenses 31 are provided on the light exiting side of the transparent substrate 28 so as to correspond to the mask patterns 29, and each project a reduced-size image of the corresponding mask pattern 29 onto the substrate 6.

Specifically, as shown in FIG. 2A, the microlens array 27 has the plurality of mask patterns 29 and the plurality of microlenses 31, which are arranged in a matrix with columns extending in the scanning direction of the substrate 6 (the direction indicated by the arrow in FIG. 2A) and rows extending in the direction orthogonal to the scanning direction. Furthermore, as shown in FIG. 2A, the number of mask patterns 29 and microlenses 31 lined up in the scanning direction of the substrate 6 (hereafter, referred to as "substrate transport direction") so as to correspond to the second TFT formation portions 24 is adjusted to be smaller than the number of mask patterns 29 and microlenses 31 lined up in this transport direction so as to correspond to the first TFT formation portions 23.

With the above configuration, simply by multiply irradiating each of the first and second TFT formation portions 23, 24 with the pulse laser beams L through a plurality of microlenses 31 that are lined up in the substrate transport direction, the first and second TFT formation portions 23, 24 can be irradiated with different irradiation doses (energies) of the pulse laser beams L. Thus, upon completion of such annealing, the amorphous silicon film in the first and second TFT formation portions 23, 24 can be crystallized into polysilicon films having different crystalline states.

In the present embodiment, the laser annealing of the first TFT formation portions 23 is completed with multiple irradiation, in particular, three shots of irradiation of the pulse laser beams L, and the laser annealing of the second TFT formation portions 24 is completed with a single shot of such laser irradiation, but the numbers of shots of irradiation of the pulse laser beams L are not limited to these. Furthermore, although the number of microlenses 31 for the second TFT formation portions 24 does not have to be adjusted in accordance with the adjusted number of the second TFT formation portions 24, the number of microlenses 31 is adjusted to match the adjusted number of mask patterns 29 in this embodiment.

The imaging means 3 is provided upstream, in the substrate scanning direction, of the positions irradiated with the pulse laser beams L by the laser illumination optical system 2. This imaging means 3, which is disposed between adjacent two of the plurality of flotation units 7 in the scanning means 1, is a line camera comprising a linear light receiving part whose longitudinal axis is oriented in the direction orthogonal to the substrate scanning direction, and captures an image of the data lines 8 and select lines 9 previously formed on the substrate 6. The imaging means 3 is capable of capturing an image of the data lines 8 and select lines 9 on the surface of the substrate 6 through the rear surface of the substrate 6. Furthermore, the imaging means 3 is configured to move in fine increments in the direction orthogonal to the substrate scanning direction integrally in synchronization with the alignment movement of the laser illumination optical system 2 or the microlens array 27 in this direction caused by the alignment means 4 (described later).

The alignment means 4 is provided so as to be able to move the laser illumination optical system 2 or the microlens array 27 in fine increments in the direction orthogonal to the substrate scanning direction. This alignment means 4 is provided for aligning the positions of the mask patterns 29 of the microlens array 27 with the positions of the first and second TFT formation portions 23, 24 on the substrate 6. Under the control of a controller 5 (described later), the alignment means 4 moves the laser illumination optical system 2 or microlens array 27 in fine increments in the direction orthogonal to the scanning direction of the substrate 6 so as to correct lateral misalignment of the substrate 6 in this direction. The following description assumes a case in which the alignment means 4 moves the microlens array 27 in fine increments.

Figure 5:
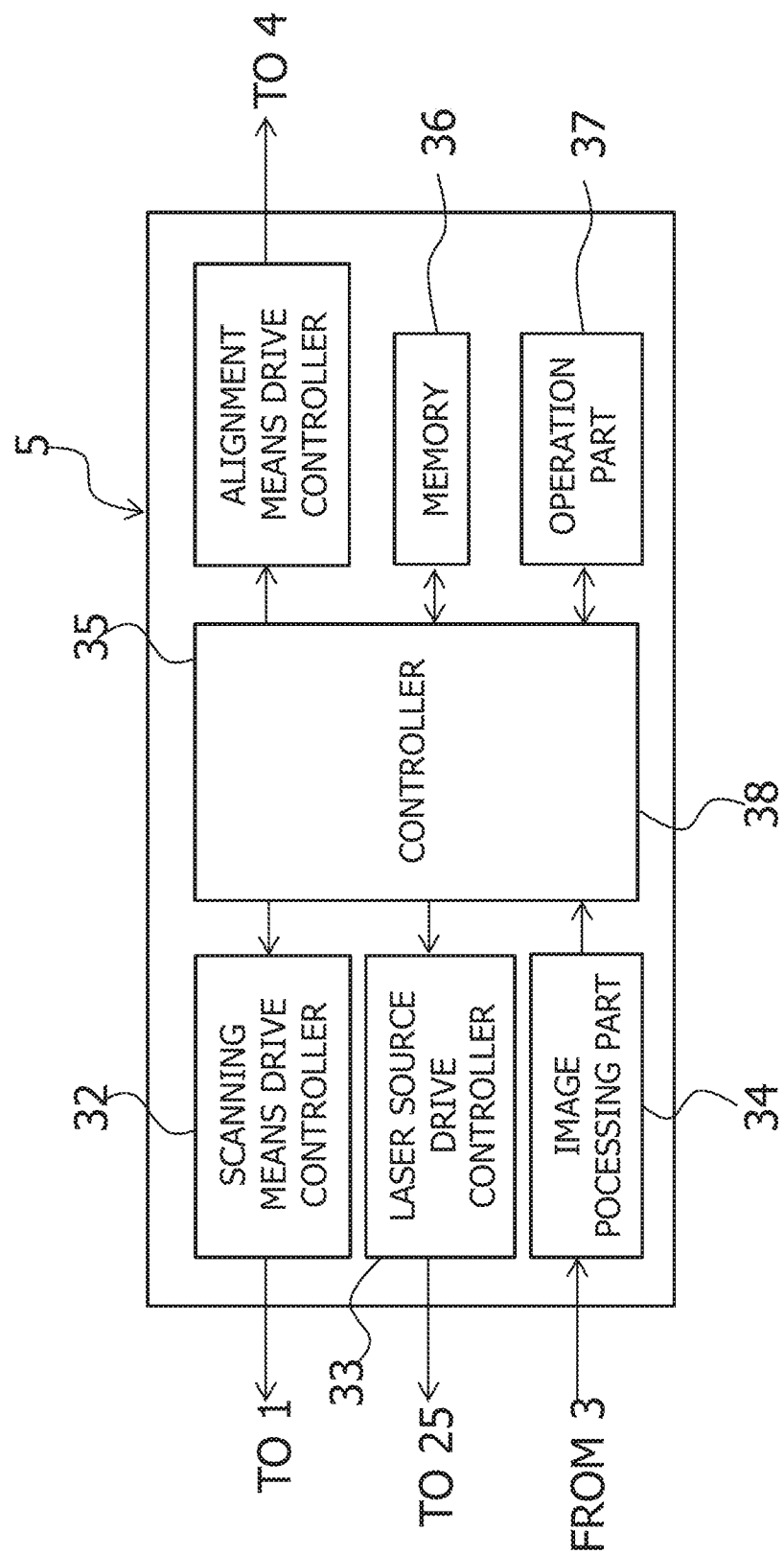
FIG. 5 is a block diagram showing a schematic configuration of a controller of the laser annealing apparatus according to the present invention.

The controller 5 is provided which is electrically connected to the scanning means 1, the laser illumination optical system 2, the imaging means 3, and the alignment means 4. The controller 5 controls the scanning means 1 so as to scan the substrate 6, in a state of floating a predetermined distance above the flotation units 7, at a constant speed in the direction indicated by the arrow in FIG. 1. Also, the controller 5 controls the light emission timing by driving the laser source 25 to emit laser beams each time first and second TFT formation portion 23 or 24 reach focal positions of the pulse laser beams L that are established by a microlens 31 of the microlens array 27, and controls the driving of the alignment means 4 so as to correct lateral misalignment of the substrate 6 by calculating the amount of lateral misalignment based on the image data received from the imaging means 3. As shown in FIG. 5, the controller 5 comprises a scanning means drive controller 32, a laser source drive controller 33, an image processing part 34, an alignment means drive controller 35, a memory 36, an operation part 37, and a controller 38.

Here, the scanning means drive controller 32 controls the start and stop of air blowing from the flotation units 7, and also controls the start and stop as well as the scanning direction and scanning speed of the substrate 6 by the scanning means 1.

The laser source drive controller 33 controls the emission of the pulse laser beams L by the laser source 25 based on a light emission instruction received from the operation part 37 (described later).

The image processing part 34 processes the image data received from the imaging means 3, and detects the positions of the data lines 8 based on luminance variation in the direction orthogonal to the scanning direction of the substrate 6, and detects a select line 9, based on luminance variation in the scanning direction of the substrate 6. Then, the image processing part 34 outputs, to the operation part 37 (described later), position information of a previously specified data line 8 indicating, for example, the position of the right edge of the data line 8, and detection information of the select line 9, specifically, detection information of, for example, its edge located downstream in the scanning direction of the substrate 6.

The alignment means drive controller 35 controls the driving of the alignment means 4 so as to reduce the amount of lateral misalignment of the substrate 6 calculated by the operation part 37 to zero.

The memory 36 stores information such as the scanning speed of the scanning means 1, a target travel distance that the substrate 6 is to travel in a period from the time the imaging means 3 first detects a select line 9 to the time the driving of the laser source 25 starts, position information indicating a reference position predefined for the light receiving part of the imaging means 3, and the array pitch W of the first and second TFT formation portions 23, 24 in the scanning direction. The memory 36 can also temporarily store the calculation results of the operation part 37.

The operation part 37 calculates the travel distance of the substrate 6 based on the scanning speed and time of the scanning means 1. The operation part 37 compares the calculated travel distance with the target travel distance of the substrate 6 retrieved from the memory 36 as well as with the array pitch W of the first and second TFT formation portions 23, 24 in the scanning direction, and outputs a light emission instruction of the pulse laser beams L to the laser source drive controller 33. Also, based on the position information of the data line 8 received from the image processing part 34 and the position information indicating the reference position predefined for the imaging means 3 and retrieved from the memory 36, the operation part 37 calculates the distance between the data line 8 and the reference position. The operation part 37 compares this calculated distance with a reference distance between the data line 8 and the reference position stored in the memory 36, thereby calculating the difference between these distances. Then, the operation part 37 outputs the difference to the alignment means drive controller 35. Here, the travel distance of the substrate 6 may be detected by a position sensor provided in the scanning means 1, or may be calculated by counting the number of pulses of a pulse motor in the movement mechanism that moves the substrate 6.

The controller 38 controls the entire apparatus in an integrated manner, and is for example a control PC (Personal Computer).

Next, the operation of the first embodiment of the laser annealing apparatus configured in this manner and the laser annealing method are described. First, the substrate 6 is placed on the scanning surface of the scanning means 1 with the surface on which the amorphous silicon film is formed facing up, and the edges of the substrate 6 are held by the movement mechanism. Specifically, the substrate 6 is disposed such that the data lines 8 are parallel with the substrate scanning direction.

Next, when the switch to start annealing is thrown, air is blown from the flotation units 7 of the scanning means 1 and causes the substrate 6 to float, and scanning of the substrate 6 by the movement mechanism begins in the direction indicated by the arrow in FIG. 1.

Then, an image of the data lines 8 and the select lines 9 formed on the front surface of the substrate 6 is captured from the rear surface side by the imaging means 3 through the substrate 6. The image data captured by the imaging means 3 is processed by the image processing part 34. Specifically, the image processing part 34 detects the select line 9 that is located furthest downstream in the substrate scanning direction based on the luminance variation in the substrate scanning direction, specifically, detects, for example, the edge, located downstream in the substrate scanning direction, of this select line 9, and outputs the resultant detection information to the operation part 37.

Figure 6:
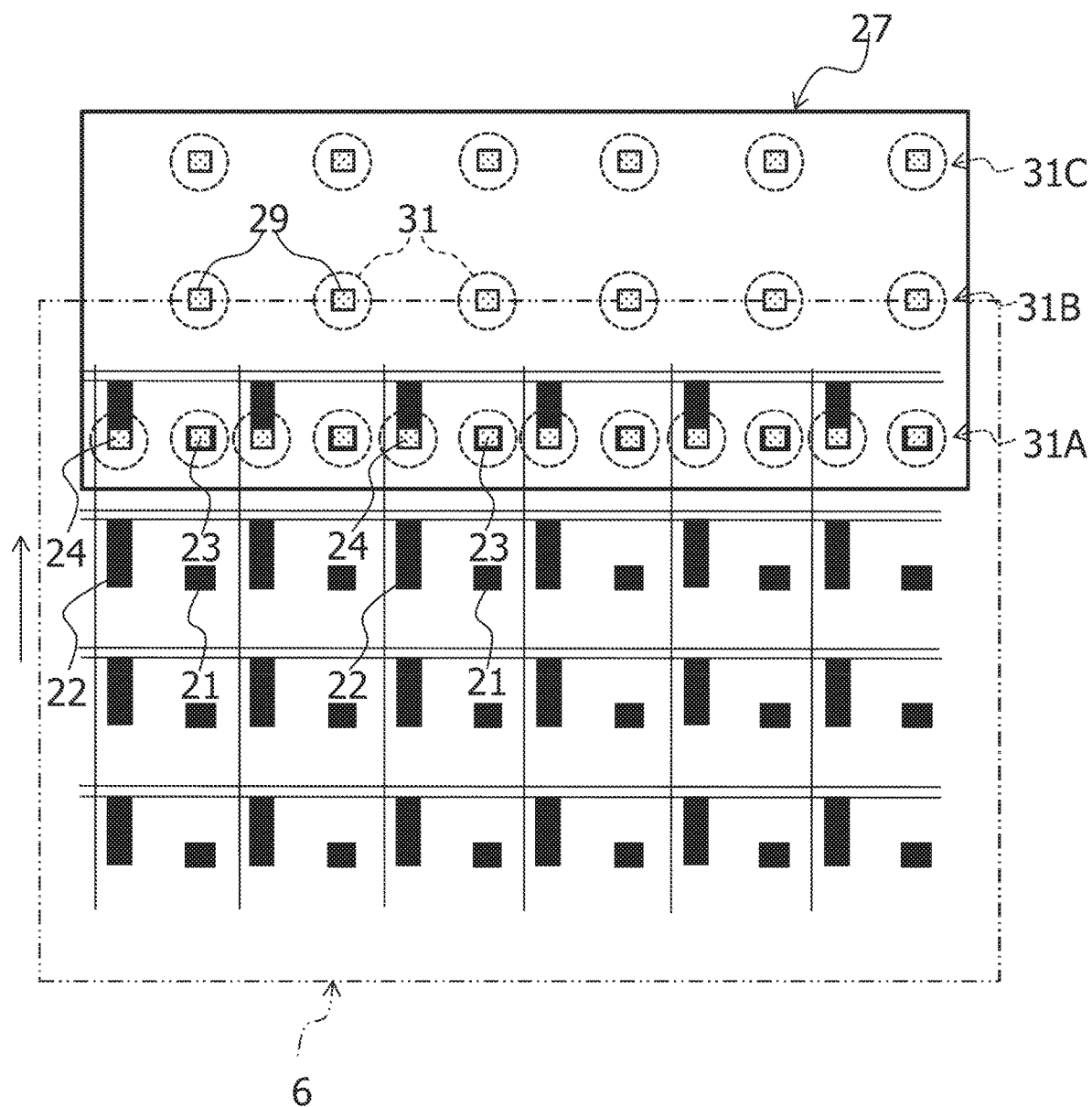
FIG. 6 is a diagram for illustrating the first round of annealing by a laser annealing method according to the present invention.

Triggered by the receipt of the detection information of the select line 9 from the image processing part 34, the operation part 37 calculates the travel distance of the substrate 6. The operation part 37 compares the thus-calculated travel distance of the substrate 6 with the target travel distance of the substrate 6 retrieved from the memory 36. When these distance values match, the operation part 37 outputs, to the laser source drive controller 33, an instruction to emit a pulse laser beam L. As shown in FIG. 6, this moment coincides with when the first and second TFT formation portions 23, 24 positioned furthest downstream in the substrate scanning direction arrive at the focal positions of the pulse laser beams L established by the microlenses 31 of the microlens array 27 (collectively referred to as "first microlens row 31A" below) that are positioned furthest upstream in the substrate scanning direction.

Upon receiving the instruction from the operation part 37 to emit a pulse beam L, the laser source drive controller 33 drives the laser source 25 to emit a pulse laser beam L at a predetermined frequency. Then, the coupling optical system 26 expands the luminous flux diameter of the pulse laser beam L emitted from the laser source 25, and then converts the pulse laser beam L into parallel beams having uniform luminance distribution, so that the resultant pulse laser beams L illuminate the microlens array 27. After that, the pulse laser beams L pass through the mask patterns 29 formed in the light shielding mask 30 of the microlens array 27, and are then each focused on the substrate 6 by the corresponding microlens 31.

Through this process, as shown in FIG. 6, the first round of annealing with the pulse laser beams L is performed on the amorphous silicon film in the first and second TFT formation portions 23, 24 positioned furthest downstream in the substrate scanning direction. As a result, the amorphous silicon film in these first and second TFT formation portions 23, 24 is crystallized into a polysilicon film.

Meanwhile, the operation part 37 continues to calculate the travel distance of the substrate 6. When the travel distance of the substrate 6 matches the array pitch W of the first and second TFT formation portions 23, 24 in the substrate scanning direction, the operation part 37 outputs, to the laser source drive controller 33, another instruction to emit a pulse laser beam L.

In response, the laser source drive controller 33 drives the laser source 25 to emit a pulse laser beam L in a similar manner as described above, so that the resultant pulse laser beams L illuminate the microlens array 27.

After that, the pulse laser beams L pass through the mask patterns 29 of the microlens array 27, and are then each focused on the substrate 6 by the corresponding microlens 31. At that time, the substrate 6 has moved further by a distance equivalent to the array pitch W of the first and second TFT formation portions 23, 24 in the substrate scanning direction. Accordingly, as shown in FIG. 7, the first and second TFT formation portions 23, 24 positioned furthest downstream in the substrate scanning direction arrive at the focal positions of the pulse laser beams L established by the microlenses 31 of the microlens array 27 (collectively referred to as "second microlens row 31B" below) that are positioned adjacently downstream of the first microlens row 31A.

Figure 7:
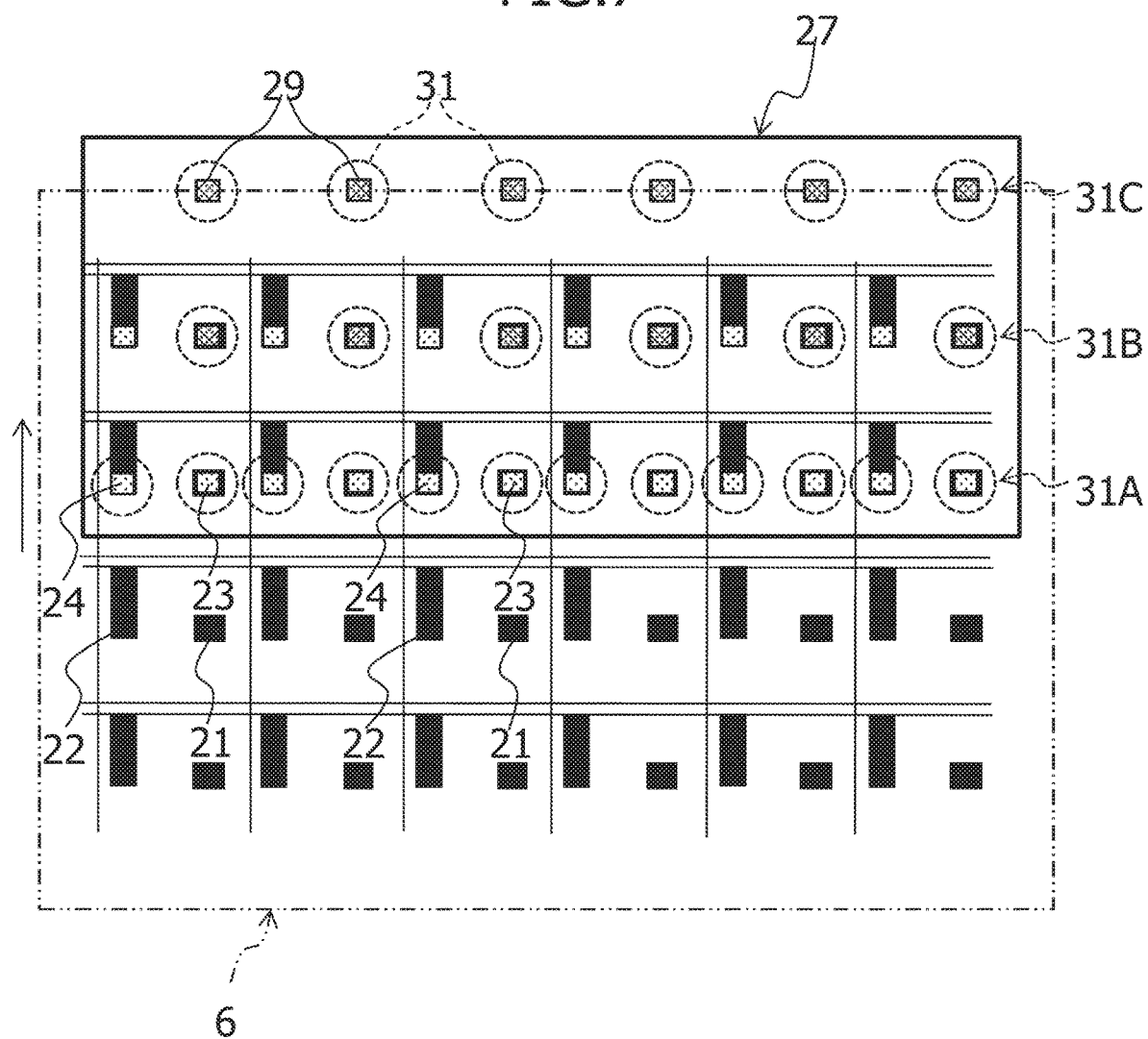
FIG. 7 is a diagram for illustrating the second round of annealing by the laser annealing method according to the present invention.

Furthermore, as shown in FIG. 7, the first and second TFT formation portions 23, 24 positioned adjacently upstream of the first and second TFT formation portions 23, 24 that are positioned furthest downstream in the substrate scanning direction arrive at the focal positions of the pulse laser beams L established by the first microlens row 31A of the microlens array 27.

Accordingly, among the pulse laser beams L having passed through the microlens array 27, the pulse laser beams L having passed through the second microlens row 31B are focused on the first TFT formation portions 23 positioned furthest downstream in the substrate scanning direction, thereby subjecting these first TFT formation portions 23 to the second round of annealing. As a result, the irradiation dose (energy) of the pulse laser beam L in each of these first TFT formation portions 23 increases and promotes crystal growth in these portions.

The third microlens row 31B contains no mask patterns 29 or microlenses 31 at positions corresponding to the second TFT formation portions 24. Thus, the second TFT formation portions 24 positioned furthest downstream in the substrate scanning direction are not irradiated with pulse laser beams L. Accordingly, these second TFT formation portions 24 are maintained in the state of having undergone only the first round of annealing, without further crystal growth toward a polysilicon film.

Among the pulse laser beams L having passed through the microlens array 27, the pulse laser beams L having passed through the first microlens row 31A are focused on the first and second TFT formation portions 23, 24 positioned adjacently upstream of the first and second TFT formation portions 23, 24 that are positioned furthest downstream in the substrate scanning direction, thereby subjecting these first and second TFT formation portions 23, 24 to the first round of annealing. As a result, the amorphous silicon film in these portions is crystallized into a polysilicon film.

Meanwhile, the operation part 37 continues to calculate the travel distance of the substrate 6. When the travel distance of the substrate 6 matches the array pitch W of the first and second TFT formation portions 23, 24 in the substrate scanning direction, the operation part 37 outputs, to the laser source drive controller 33, another instruction to emit a pulse laser beam L.

In response, the laser source drive controller 33 drives the laser source 25 to emit a pulse laser beam L, so that the resultant pulse laser beams L illuminate the microlens array 27.

After that, the pulse laser beams L pass through the mask patterns 29 on the microlens array 27, and are then each focused on the substrate 6 by the corresponding microlens 31. At that time, the substrate 6 has moved still further by a distance equivalent to the array pitch W of the first and second TFT formation portions 23, 24 in the substrate scanning direction. Accordingly, as shown in FIG. 8, the first and second TFT formation portions 23, 24 positioned furthest downstream in the substrate scanning direction arrive at the focal positions of the pulse laser beams L established by the microlenses 31 of the microlens array 27 (collectively referred to as "third microlens row 31C" below) that are positioned one row away downstream from the first microlens row 31A.

Figure 8:
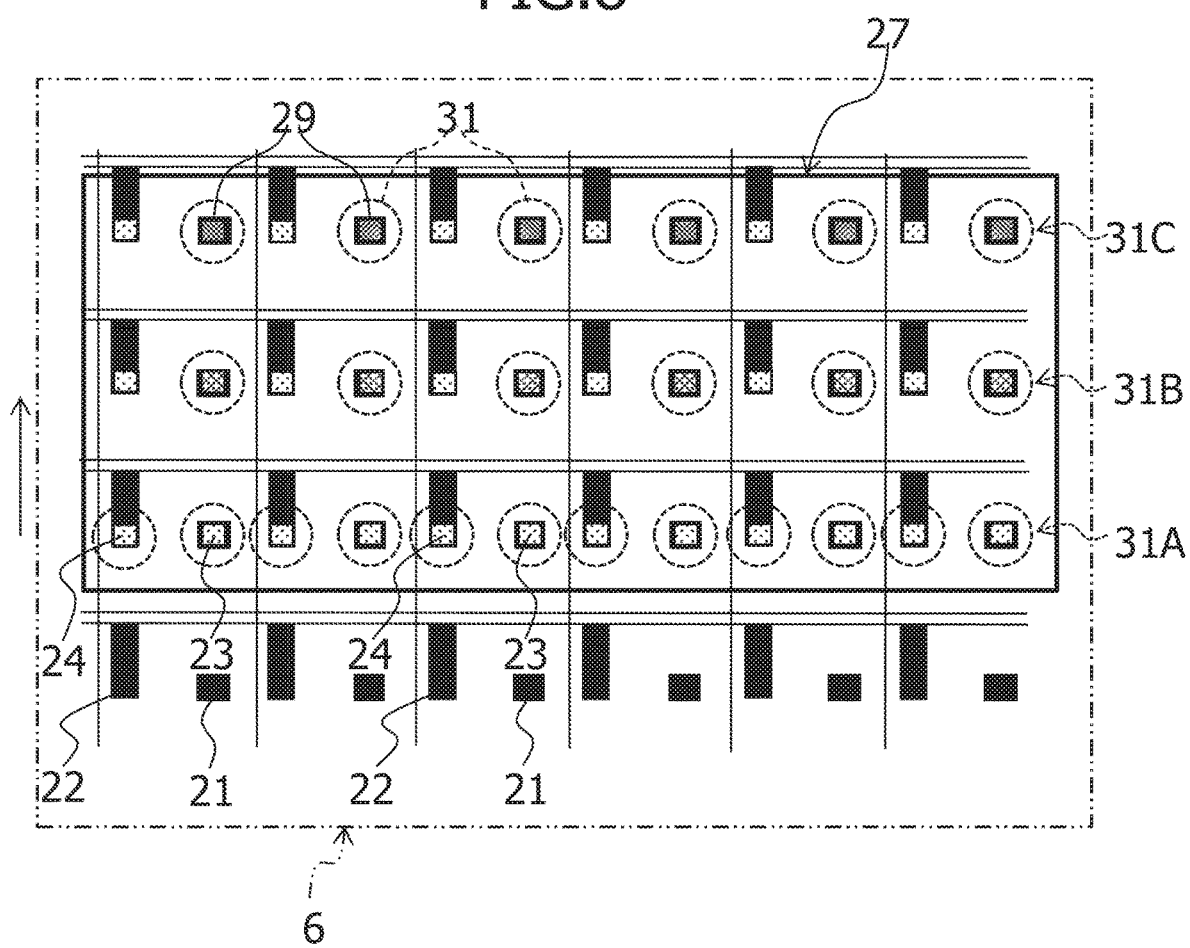
FIG. 8 is a diagram for illustrating the third round of annealing by the laser annealing method according to the present invention.

Furthermore, as shown in FIG. 8, the first and second TFT formation portions 23, 24 positioned adjacently upstream of the first and second TFT formation portions 23, 24 that are positioned furthest downstream in the substrate scanning direction arrive at the focal positions of the pulse laser beams L established by the second microlens row 31B of the microlens array 27.

In addition, as shown in FIG. 8, the first and second TFT formation portions 23, 24 positioned one row away upstream from the first and second TFT formation portions 23, 24 that are positioned furthest downstream in the substrate scanning direction arrive at the focal positions of the pulse laser beams L established by the first microlens row 31A of the microlens array 27.

Accordingly, among the pulse laser beams L having passed through the microlens array 27, the pulse laser beams L having passed through the third microlens row 31C are focused on the first TFT formation portions 23 positioned furthest downstream in the substrate scanning direction, thereby subjecting these first TFT formation portions 23 to the third round of annealing. As a result, the irradiation dose (energy) in each of these first TFT formation portions 23 further increases, and promotes further crystal growth in these portions.

As shown in FIG. 8, the third microlens row 31C contains no mask patterns 29 or microlenses 31 at positions corresponding to the second TFT formation portions 24. Thus, the second TFT formation portions 24 positioned furthest downstream in the substrate scanning direction are not irradiated with the pulse laser beams L. Accordingly, these second TFT formation portions 24 are maintained in the state of having undergone only the first round of annealing, without further crystal growth toward a polysilicon film.

Among the pulse laser beams L having passed through the microlens array 27, the pulse laser beams L having passed through the second microlens row 31B are focused on the first TFT formation portions 23 positioned adjacently upstream of the first TFT formation portions 23 that are positioned furthest downstream in the substrate scanning direction, thereby subjecting these first TFT formation portions 23 to the second round of annealing. As a result, the irradiation dose (energy) of the pulse laser beam L in each of these first TFT formation portions 23 increases and promotes crystal growth in these portions.

The second microlens row 31B contains no mask patterns 29 or microlenses 31 at positions corresponding to the second TFT formation portions 24. Thus, the second TFT formation portions 24 positioned adjacently upstream of the second TFT formation portions 24 that are positioned furthest downstream in the substrate scanning direction are not irradiated with the pulse laser beams L. Accordingly, these second TFT formation portions 24 are maintained in the state of having undergone only the first round of annealing, without further crystal growth toward a polysilicon film.

Among the pulse laser beams L having passed through the microlens array 27, the pulse laser beams L having passed through the first microlens row 31A are focused on the first and second TFT formation portions 23, 24 positioned one row away upstream from the first and second TFT formation portions 23, 24 that are positioned furthest downstream in the substrate scanning direction, thereby subjecting the former first and second TFT formation portions 23, 24 to the first round of annealing. As a result, the amorphous silicon film in these portions is crystallized into a polysilicon film.

After that, in the same manner as above, annealing with multiple irradiation, in particular, three shots of irradiation of the pulse laser beams L is also performed in the other first TFT formation portions 23, and annealing with a single shot of irradiation of the pulse laser beams L is also performed in the other second TFT formation portions 24. As a result, the irradiation dose of the pulse laser beam L (cumulative energy of the pulse laser beam L) in each first TFT formation portion 23 differs from that of each second TFT formation portion 24. This makes it possible to crystallize the amorphous silicon film in the first and second TFT formation portions 23, 24 into polysilicon films having different crystalline states.

Figure 9:
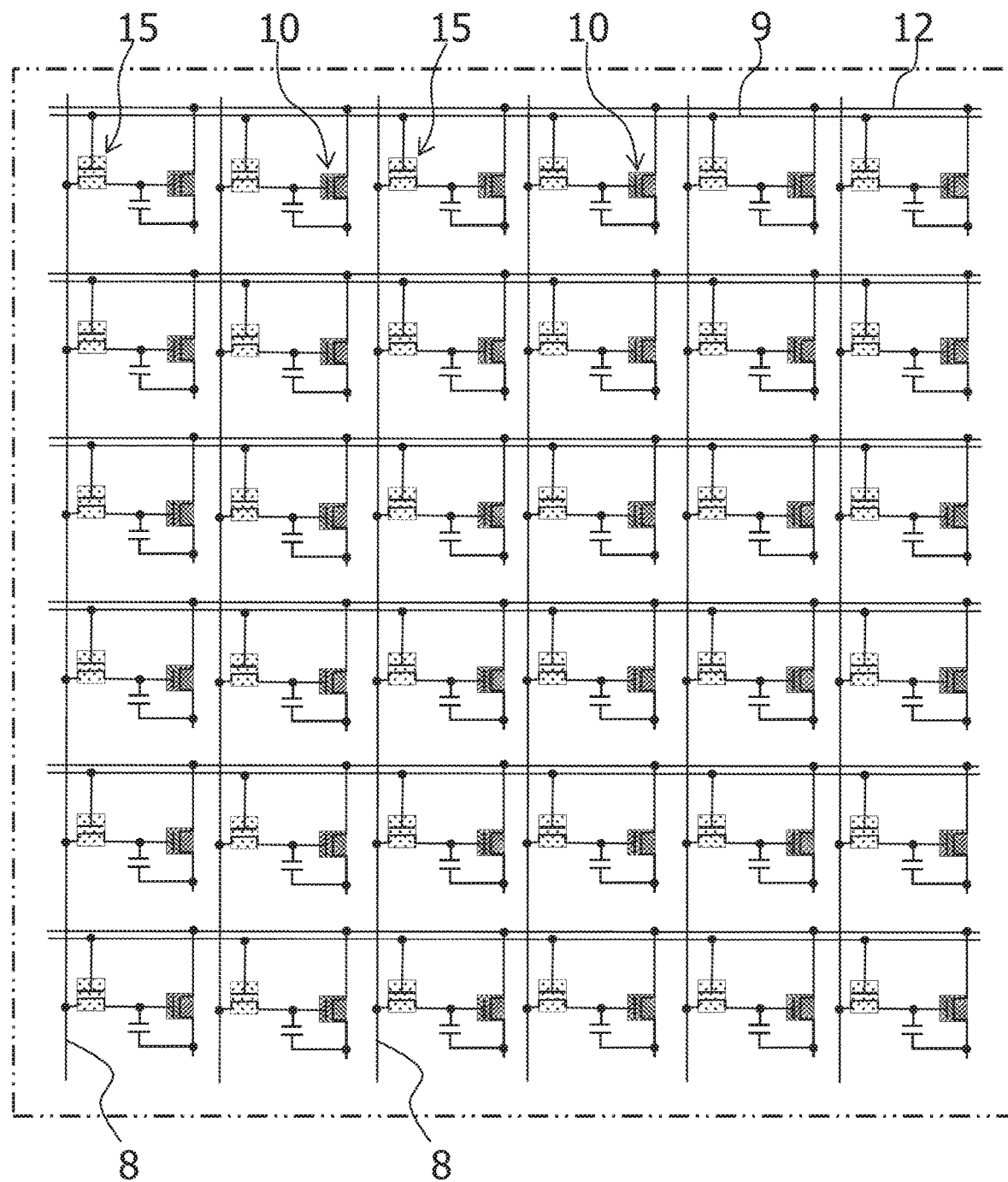
FIG. 9 is a plan view of a substrate having thin film transistors for organic EL applications manufactured by the laser annealing method according to the present invention.

Subsequently, unnecessary portions of the amorphous silicon film and polysilicon film are etched off to finish a semiconductor layer on each of the gate electrodes 21, 22. After that, a source electrode, a drain electrode, a storage capacitor 20, and an insulating protective film are formed in this order on the semiconductor layer. In this way, a TFT substrate for organic EL applications including a plurality of driver TFTs 10 and a plurality of selector TFTs 15 as shown in FIG. 9 is manufactured such that the crystalline state in the polysilicon semiconductor layer of each driver TFT 10 differs from that of each selector TFT 15.

Figure 10A:
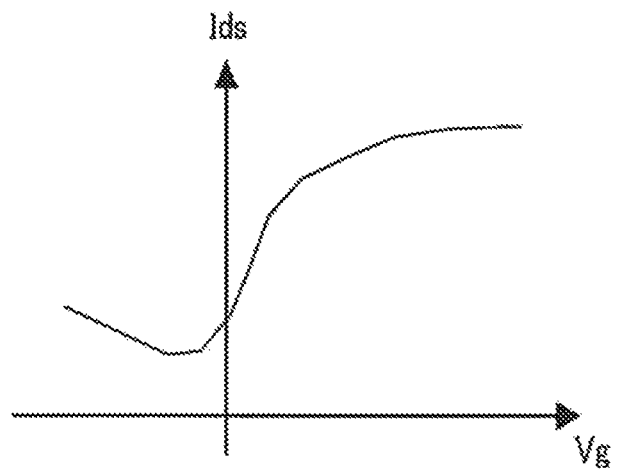
FIGS. 10A and 10B are diagrams showing the electronic properties of the thin film transistors for organic EL applications manufactured by the laser annealing method according to the present invention.

In this TFT substrate, the polysilicon film of each driver TFT 10 (first TFT formation portion 23), which receives a greater irradiation dose or a greater cumulative energy of the pulse laser beam L, has a larger crystal grain size than that of the polysilicon film of each selector TFT 15 (second TFT formation portion 24), which receives a smaller irradiation dose or a smaller cumulative energy of the pulse laser beam L. Accordingly, as shown in FIG. 10A, each driver TFT 10 has electronic properties that permit a somewhat large off-state leakage current (approximately $1 \times 10^{-9}$ A) but allow greater electron mobility (approximately 30 $cm^2/Vs$), and is capable of supplying a large current to the organic EL device.

Figure 10B:
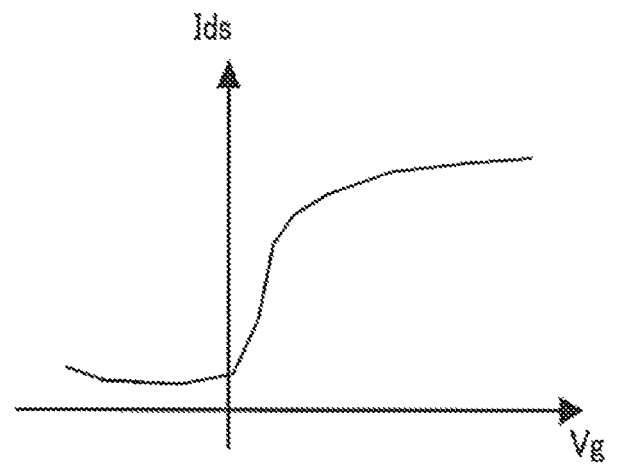

On the other hand, because the crystal grain size of the polysilicon film of each selector TFT 15 (second TFT formation portion 24) is smaller than the crystal grain size of the polysilicon film of each driver TFT 10 (first TFT formation portion 23), the selector TFT 15 has electronic properties that allow only small electron mobility (approximately 2 $cm^2/Vs$) but permit a smaller off-state leakage current ($1 \times 10^{-11}$A), and is capable of maintaining the gate voltage of the corresponding driver TFT 10 at a constant level, as shown in FIG. 10B.

Thus, with the laser annealing method of the present invention, the first and second TFT formation portions 23, 24 on the substrate 6 can be irradiated with the pulse laser beams L at different irradiation doses between the first TFT formation portion 23 and the second TFT formation portion 24 in a single laser annealing step. As a result, the amorphous silicon film in the first TFT formation portions 23 can be crystallized into a polysilicon film having a crystalline state, and the amorphous silicon film in the second TFT formation portions 24 can be crystallized into a polysilicon film having another crystalline state that is different from that of the polysilicon film in the first TFT formation portions 23. Therefore, when a thin film transistor substrate for organic EL applications is manufactured by using the laser annealing method according to the present invention, it is possible to provide the driver TFTs 10 with electronic properties required therefor and provide the selector TFTs 15 with different electronic properties that are required therefor.

During laser annealing performed on the substrate 6 while it is scanned, the imaging means 3 constantly captures an image of the data lines 8, and the image processing part 34 performs image processing on this image and detects the position of a specific data line 8 based on the luminance variation in the direction orthogonal to the scanning direction of the substrate 6. Meanwhile, based on the information on the detected position of this data line 8 and the information on a reference position preset for the imaging means 3, the operation part 37 calculates the distance between these two positions. Then, the operation part 37 compares the thus-calculated distance with a reference distance stored in the memory 36 and calculates the amount of lateral misalignment of the substrate 6. Then, the alignment means drive controller 35 drives the alignment means 4 to move the microlens array 27 integrally with the imaging means 3 in fine increments in the direction orthogonal to the substrate scanning direction so as to reduce the amount of this lateral misalignment to zero. As a result, the lateral misalignment of the substrate 6 is corrected, and annealing is performed by irradiating the pulse laser beams L onto the first and second TFT formation portions 23, 24 on the substrate 6 with high positional accuracy.

Figure 11A:
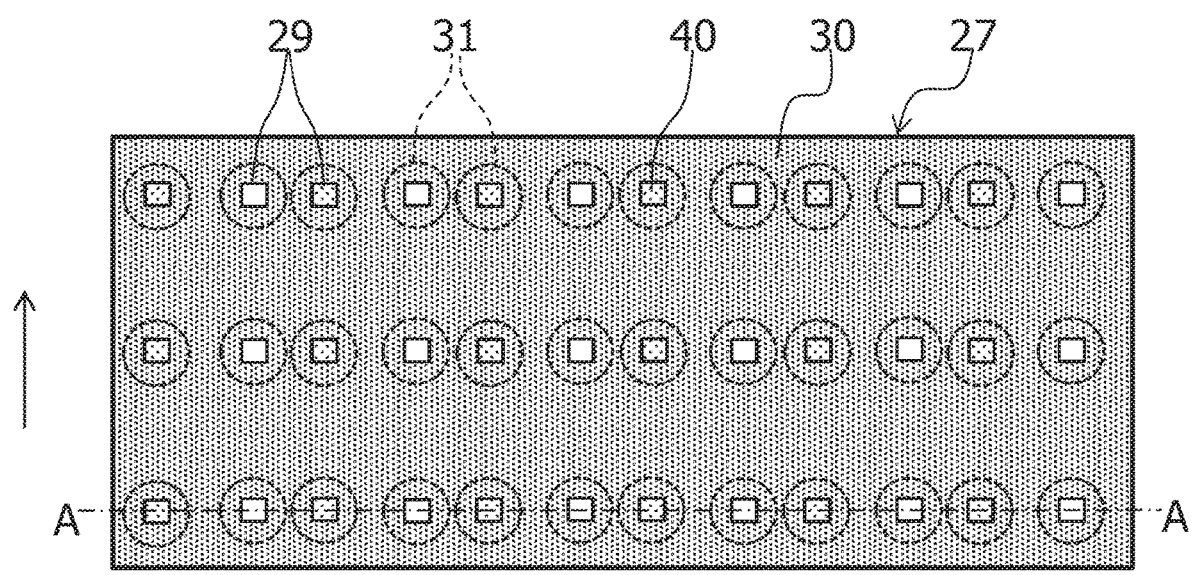
FIGS. 11A and 11B are diagrams showing a modified example of the microlens array used in the first embodiment.
Figure 11B:
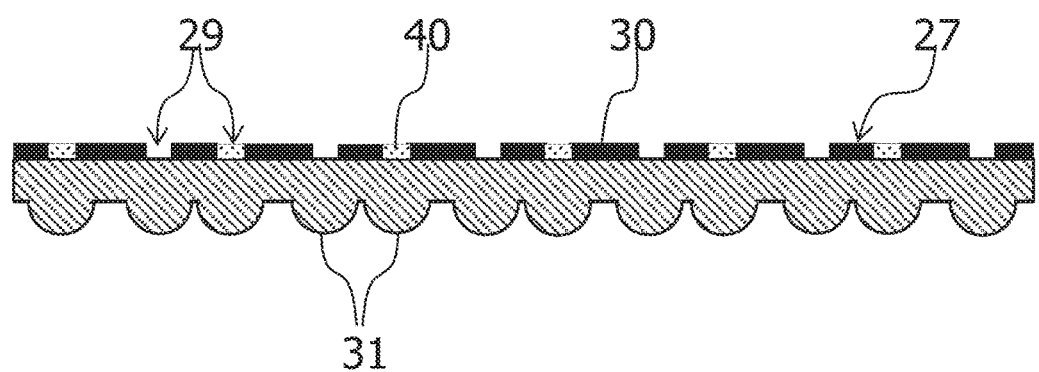

In the first embodiment, the microlens array 27 contains a plurality of mask patterns 29 and a plurality of microlenses 31, which are arranged in a matrix with columns extending in the scanning direction of the substrate 6 and rows extending in the direction orthogonal to this scanning direction, and the numbers of the mask patterns 29 and the microlenses 31 that are lined up in the scanning direction of the substrate 6 so as to correspond to the second TFT formation portions 24 are adjusted so as to be smaller than the numbers of the mask patterns 29 and the microlenses 31 that are lined up in this scanning direction so as to correspond to the first TFT formation portions 23. However, the present invention is not limited to this. Alternatively, as shown in FIGS. 11A and 11B, a dimmer film 40 with a predetermined light transmittance may be formed on the mask patterns 29 corresponding to the second TFT formation portions 24 so as to adjust the amount of light transmitted therethrough to be smaller than the amount of light transmitted thorough the mask patterns 29 corresponding to the first TFT formation portions 23. In this case, both the first and second TFT formation portions 23, 24 may be annealed with multiple irradiation of pulse laser beams L through the microlenses 31. However, when the annealing of the first and second TFT formation portions 23, 24 is to be completed by a single shot of irradiation of the pulse laser beams L, the microlens array 27 may have a single mask pattern and microlens row in which a plurality of mask patterns 29 and a plurality of microlenses 31 are lined up in the direction orthogonal to the substrate scanning direction.

Figure 12:
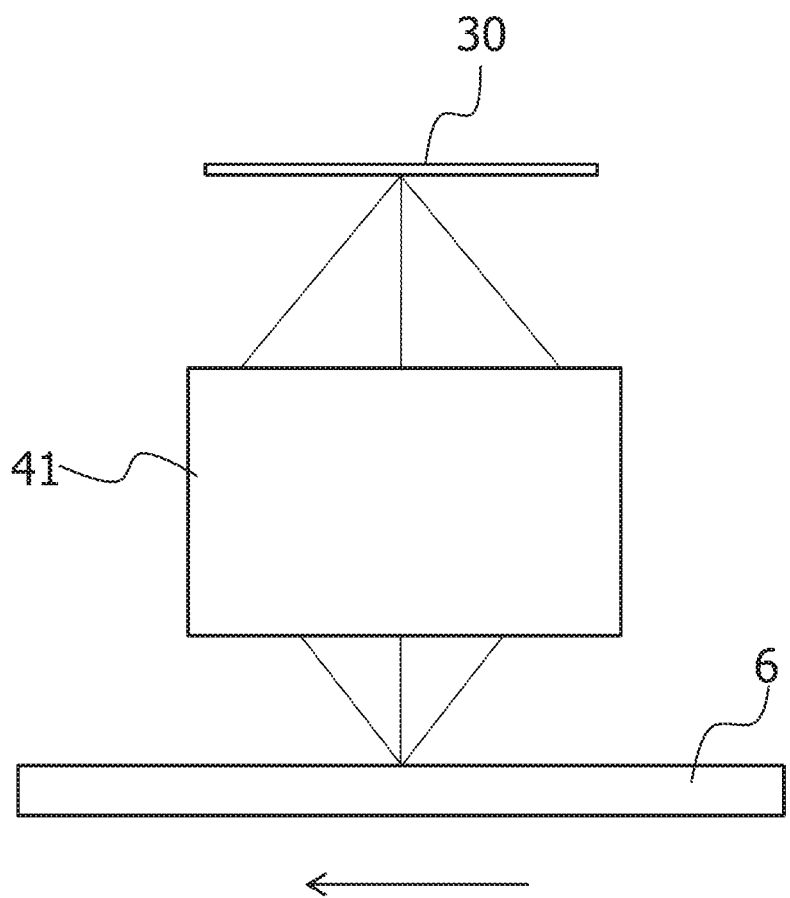
FIG. 12 is an enlarged front view of substantial portions for illustrating a second embodiment of a laser annealing apparatus according to the present invention.

FIG. 12 is an enlarged front view of substantial portions for illustrating a second embodiment of a laser annealing apparatus according to the present invention. Here, portions that differ from those of the first embodiment will be described. In the first embodiment, through the microlenses 31, which are provided individually corresponding to the mask patterns 29 formed on the light shielding mask 30, reduced-size images of the mask patterns 29 are projected onto the substrate 6. Instead, in this second embodiment, reduced-size images of the mask patterns 29 are projected onto the substrate 6 through a single projection lens (projecting optical system) 41. The projection lens 41 may have a lens configuration that forms either an inverted image or an erect image of the light shielding mask 30 on the substrate 6.

Figure 13A:
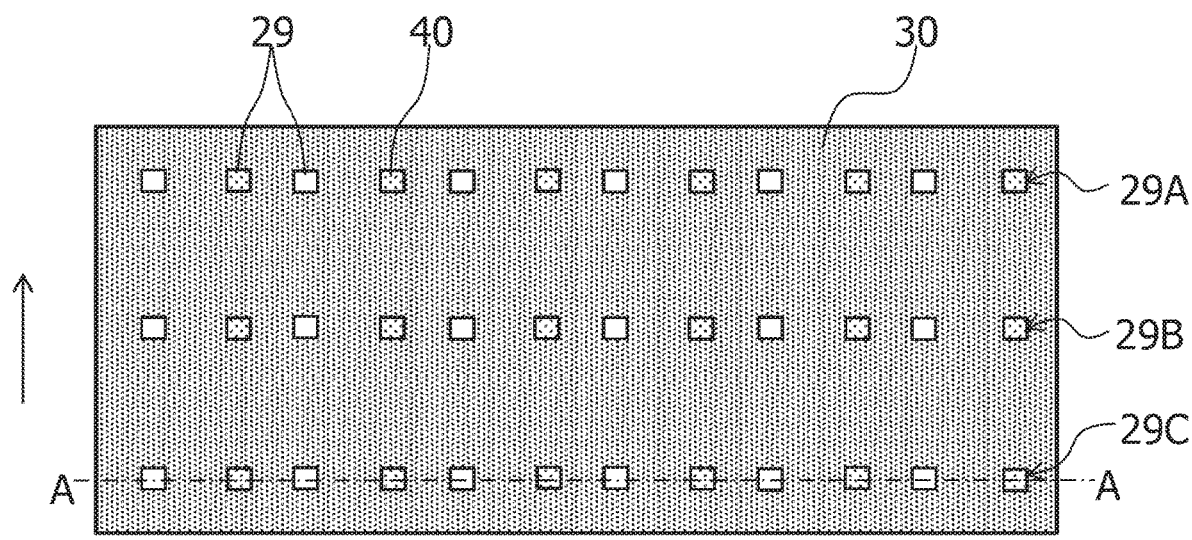
FIGS. 13A and 13B are diagrams showing a configuration example of a light shielding mask used in the second embodiment.
Figure 13B:
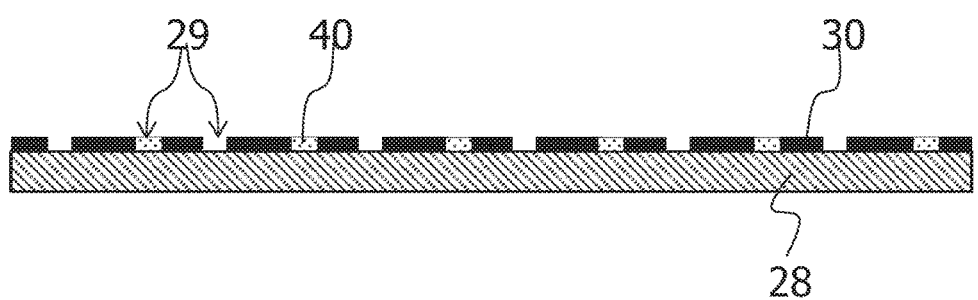

When the projection lens 41 has a lens configuration that forms an inverted image, annealing may be performed using the light shielding mask 30 having the mask patterns 29 that are arranged in 180° rotational symmetry about the center of the light shielding mask 30 with respect to the mask patterns 29 shown in FIGS. 2A and 2B or FIGS. 11A and 11B. For example, the light shielding mask 30 shown in FIGS. 13A and 13B corresponds to the mask obtained by rotating the light shielding mask 30 shown in FIGS. 11A and 11B by 180° about its center. In other words, as shown in FIGS. 13A and 13B, in the light shielding mask 30 according to the second embodiment, the dimmer film 40 is provided on the mask patterns 29 corresponding to the second TFT formation portions 24 so that the amount of light transmitted through the mask patterns 29 corresponding to the second TFT formation portions 24 can be smaller than the amount of light transmitted through the mask patterns 29 corresponding to the first TFT formation portions 23. Needless to say, the array pitch of the mask patterns 29 is set to a value obtained by converting the longitudinal and lateral array pitch of the first and second TFT formation portions 23, 24 using the magnification of the projection lens 41.

In this case, the irradiation of the pulse laser beams L starts when the first and second TFT formation portions 23, 24 that are positioned furthest downstream in the substrate scanning direction arrive at the focal positions of a row of the mask patterns 29 positioned furthest downstream in the substrate scanning direction among the mask patterns 29 formed on the light shielding mask 30 so as to be arranged in rows extending in the direction orthogonal to the substrate scanning direction, such as the mask pattern row 29A of the mask pattern rows 29A, 29B, 29C shown in FIG. 13. Thereafter, in the same manner as in the first embodiment, the substrate 6 is irradiated with the pulse laser beams L each time the substrate 6 has traveled by a distance equivalent to the array pitch W of the first and second TFT formation portions 23, 24 in the substrate scanning direction, thereby laser annealing the amorphous silicon film in the first and second TFT formation portions 23, 24 and crystallizing the amorphous silicon film into polysilicon films.

On the other hand, when the projection lens 41 has a lens configuration that forms an erect image, annealing may be performed using the light shielding mask 30 having the mask patterns 29 that are arranged in the same manner as the mask patterns 29 shown in FIGS. 2A and 2B or FIGS. 11A and 11B. In this case also, the array pitch of the mask patterns 29 is set to a value obtained by converting the longitudinal and lateral array pitch of the first and second TFT formation portions 23, 24 using the magnification of the projection lens 41. Furthermore, the irradiation of the pulse laser beams L starts when the first and second TFT formation portions 23, 24 that are positioned furthest downstream in the substrate scanning direction arrive at the focal positions of a row of the mask patterns 29 positioned furthest downstream in the substrate scanning direction among the mask patterns 29 formed on the light shielding mask 30 so as to be arranged in rows extending in the direction orthogonal to the substrate scanning direction. The subsequent irradiation timings of the pulse laser beams L are the same as those in the first embodiment.

In the first and second embodiments, the substrate 6 is laser annealed while the substrate 6 is scanned, but the present invention is not limited to this. Alternatively, the substrate 6 placed to be stationary may be laser annealed with a single shot or multiple shots of laser irradiation. In this case, the substrate 6 may be laser annealed by irradiating the TFT formation portions with pulse laser beams L at different irradiation doses through the mask patterns 29 provided corresponding to the TFT formation portions on the substrate 6, and through the microlenses 31 or the projection lens 41. Such different irradiation doses of the pulse laser beams L may be realized by adjusting the amount of light to be transmitted through the mask patterns 29.

Furthermore, in the first and second embodiments, the first and second TFT formation portions 23, 24 are irradiated with the pulse laser beams L emitted from a single laser source 25 at different irradiation doses. However, the present invention is not limited to this. Alternatively, two laser sources with different irradiation energies may be used, and the first TFT formation portions 23 may be irradiated with pulse laser beams L with an irradiation energy emitted from one of these laser sources, and the second TFT formation portions 24 may be irradiated with pulse laser beams L with a different irradiation energy emitted from the other of these laser sources.

Furthermore, in the above description, the present invention is applied to the production of a TFT substrate for organic EL applications. However, the application of the present invention is not limited to this. The present invention may also be applied to any laser annealing processes performed on amorphous silicon films to produce a plurality of TFTs with polysilicon semiconductor layers having different crystalline states.

It should be noted that the entire contents of Japanese Patent Application No. 2016-032469, filed on Feb. 23, 2016, based on which convention priority is claimed herein, is incorporated herein by reference.

It should also be understood that many modifications and variations of the described embodiments of the invention will be apparent to a person having an ordinary skill in the art without departing from the spirit and scope of the present invention as claimed in the appended claims.

What is claimed is:

1. A laser annealing apparatus for irradiating an amorphous silicon film formed on a substrate with laser beams and crystallizing the amorphous silicon film, the apparatus comprising:
scanning means including a plurality of flotation units arranged in a row, the scanning means being configured to hold edges of the substrate and scan the substrate with the substrate floated above a scanning surface of the scanning means by the flotation units;
a light shielding mask which is disposed facing the scanning surface of the scanning means and provided with a plurality of mask patterns corresponding to first and second thin film transistor formation portions on the substrate; and
a projecting optical system which is provided on a scanning means side of the light shielding mask and which is configured to form images of the plurality of mask patterns on the substrate,
wherein:
the plurality of mask patterns are arranged in a matrix with columns extending in a scanning direction of the substrate and rows extending in a direction orthogonal to the scanning direction, and
a number of mask patterns, among the plurality of mask patterns, that are arranged in each of the columns extending in the scanning direction, so as to correspond to the second thin film transistor formation portions, is smaller than a number of mask patterns, among the plurality of mask patterns, that are arranged in each of the columns extending in the scanning direction so as to correspond to the first thin film transistor formation portions, and
wherein the apparatus is configured to:
perform multiple irradiation of pulse laser beams on the first thin film transistor formation portions through the number of mask patterns that are arranged in each of the columns extending in the scanning direction for the first thin film transistor formation portions, to cause crystallization of the amorphous silicon film in the first thin film transistor formation portions into a polysilicon film having a crystalline state, and
perform multiple irradiation of pulse laser beams on the second thin film transistor formation portions through the number of mask patterns that are arranged in each of the columns extending in the scanning direction for the second thin film transistor formation portions, to cause crystallization of the amorphous silicon film in the second thin film transistor formation portions into a polysilicon film having another crystalline state that is different from that of the polysilicon film in the first thin film transistor formation portions.

2. The laser annealing apparatus according to claim 1, wherein the projecting optical system includes a plurality of microlenses that are provided individually corresponding to the plurality of mask patterns.

3. The laser annealing apparatus according to claim 1, wherein the projecting optical system includes a projection lens that projects reduced-size images of the plurality of mask patterns onto the substrate.

* * * * *